US012559363B2

(12) United States Patent
Komatsu et al.

(10) Patent No.: US 12,559,363 B2
(45) Date of Patent: Feb. 24, 2026

(54) HIGH RELIABILITY SENSOR

(71) Applicant: Texas Instruments Incorporated, Dallas, TX (US)

(72) Inventors: Daiki Komatsu, Beppu (JP); Masamitsu Matsuura, Beppu (JP); Mao Sugeno, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 367 days.

(21) Appl. No.: 18/456,585

(22) Filed: Aug. 28, 2023

(65) Prior Publication Data

US 2025/0074765 A1 Mar. 6, 2025

(51) Int. Cl.
| | |
|---|---|
| *H01L 23/498* | (2006.01) |
| *B81B 7/00* | (2006.01) |
| *B81C 1/00* | (2006.01) |

(52) U.S. Cl.
CPC .......... B81B 7/0048 (2013.01); B81B 7/0074 (2013.01); B81C 1/00325 (2013.01);
(Continued)

(58) Field of Classification Search
CPC ................ B81B 7/0048; B81B 7/0074; B81B 2201/0214; B81B 2201/0264; B81B 2201/0278; B81B 2207/07; B81B 2207/097; B81C 1/00325; B81C 2203/0118; B81C 2203/0127; B81C 2203/019; B81C 1/00269; G01D 11/00; H01L 21/6835; H01L 23/49816; H01L 23/49838; H01L 2221/68304
See application file for complete search history.

(56) References Cited

U.S. PATENT DOCUMENTS

| | | | |
|---|---|---|---|
| 3,388,339 | A | 6/1968 | Malnar et al. |
| 8,217,724 | B2 | 7/2012 | Briggs et al. |

(Continued)

OTHER PUBLICATIONS

Y. Zhang and J. Mao, "An Overview of the Development of Antenna-in-Package Technology for Highly Integrated Wireless Devices," in Proceedings of the IEEE, vol. 107, No. 11, pp. 2265-2280, Nov. 2019, doi: 10.1109/JPROC.2019.2933267.

(Continued)

*Primary Examiner* — David Vu
(74) *Attorney, Agent, or Firm* — Ronald O. Neerings; Frank D. Cimino

(57) ABSTRACT

An electronic device includes first and second semiconductor dies, the first semiconductor die having: a side extending in a first plane of orthogonal first and second directions; a sensor circuit along the side; and a conductive terminal extending outward from the side along an orthogonal third direction, and the second semiconductor die bonded to the first semiconductor die and having: a bottom side; a lateral side; and an insulation layer, the bottom side spaced apart from and facing the side of the first semiconductor die to form a protected chamber for the sensor circuit, the lateral side of the second semiconductor die spaced apart from the conductive terminal along the first direction, the insulation layer extending along the lateral side of the second semiconductor die, and the insulation layer spaced apart from and facing the conductive terminal along the first direction.

20 Claims, 16 Drawing Sheets

(52) U.S. Cl.
CPC ................ *B81B 2201/0214* (2013.01); *B81B 2201/0264* (2013.01); *B81B 2201/0278* (2013.01); *B81B 2207/07* (2013.01); *B81C 2203/0118* (2013.01)

(56) References Cited

U.S. PATENT DOCUMENTS

| | | | |
|---|---|---|---|
| 8,624,682 B2 | 1/2014 | Ridley et al. | |
| 8,680,854 B2 | 3/2014 | Dyer et al. | |
| 8,836,327 B2 | 9/2014 | French et al. | |
| 8,906,470 B2 | 12/2014 | Overstolz et al. | |
| 9,201,404 B2 | 12/2015 | Harasaka et al. | |
| 9,418,942 B2 * | 8/2016 | Chung | H01L 24/82 |
| 9,529,334 B2 | 12/2016 | Herbsommer et al. | |
| 10,665,534 B2 * | 5/2020 | Lee | H01L 23/36 |
| 2005/0007118 A1 | 1/2005 | Kitching et al. | |
| 2005/0271250 A1 | 12/2005 | Vallone et al. | |
| 2006/0022761 A1 | 2/2006 | Abeles et al. | |
| 2007/0247241 A1 | 10/2007 | Bruan et al. | |
| 2010/0156547 A1 | 6/2010 | McGuyer et al. | |
| 2010/0189605 A1 | 7/2010 | Schmid et al. | |
| 2011/0128082 A1 | 6/2011 | Maki et al. | |
| 2011/0147367 A1 | 6/2011 | Borwick, III et al. | |
| 2013/0015850 A1 | 1/2013 | Lindorfer et al. | |
| 2013/0021208 A1 | 1/2013 | Seok et al. | |
| 2013/0026586 A1 | 1/2013 | Seok et al. | |
| 2013/0044921 A1 | 2/2013 | In et al. | |
| 2013/0059551 A1 | 3/2013 | Ginsburg et al. | |
| 2013/0147472 A1 | 6/2013 | French et al. | |
| 2013/0176703 A1 | 7/2013 | Hopper et al. | |
| 2013/0299967 A1 | 11/2013 | Daniels et al. | |
| 2014/0285289 A1 | 9/2014 | Herbsommer et al. | |
| 2014/0287701 A1 | 9/2014 | Herbsommer et al. | |
| 2014/0287703 A1 | 9/2014 | Herbsommer et al. | |
| 2014/0347074 A1 | 11/2014 | Nadeau | |
| 2014/0368377 A1 | 12/2014 | Nadeau et al. | |
| 2014/0373599 A1 | 12/2014 | Trombley et al. | |
| 2015/0001694 A1 | 1/2015 | Hopper et al. | |
| 2015/0027908 A1 | 1/2015 | Parsa et al. | |
| 2015/0028866 A1 | 1/2015 | Parsa et al. | |
| 2015/0084707 A1 | 3/2015 | Maki | |
| 2015/0244382 A1 | 8/2015 | Ishihara | |
| 2015/0277386 A1 | 10/2015 | Passilly et al. | |
| 2015/0280320 A1 | 10/2015 | Haroun et al. | |
| 2015/0295305 A1 | 10/2015 | Herbsommer et al. | |
| 2016/0276731 A1 | 9/2016 | Seok et al. | |
| 2017/0093010 A1 | 3/2017 | Herbsommer et al. | |
| 2018/0156875 A1 | 6/2018 | Herbsommer et al. | |
| 2019/0013288 A1 | 1/2019 | Kim et al. | |
| 2019/0152773 A1 | 5/2019 | Herbsommer et al. | |
| 2019/0334220 A1 | 10/2019 | Ali et al. | |
| 2019/0346814 A1 | 11/2019 | Fruehling et al. | |
| 2020/0118949 A1 | 4/2020 | Moallem et al. | |
| 2020/0194871 A1 | 6/2020 | Moallem et al. | |
| 2020/0212536 A1 | 7/2020 | Gupta et al. | |
| 2020/0241480 A1 | 7/2020 | Bahr et al. | |
| 2020/0259239 A1 | 8/2020 | Moallem et al. | |
| 2020/0259240 A1 | 8/2020 | Moallem | |
| 2020/0403299 A1 | 12/2020 | Gupta et al. | |
| 2021/0050652 A1 | 2/2021 | Moallem et al. | |

OTHER PUBLICATIONS

F. Ahmed, M. Furqan and A. Stelzer, "120-GHz and 240-GHz Broadband Bow-Tie Antennas in eWLB Package for High Resolution Radar Applications," 2018 48th European Microwave Conference (EuMC), 2018, pp. 1109-1112, doi: 10.23919/EuMC.2018.8541732.

S. Beer and T. Zwick, "122 GHz antenna-integration in a plastic package based on a flip chip interconnect," 2011 IEEE MTT-S International Microwave Workshop Series on Millimeter Wave Integration Technologies, 2011, pp. 37-40, doi: 10.1109/IMWS3.2011.6061881.

C. Wang et al., "InFO_AiP Technology for High Performance and Compact 5G Millimeter Wave System Integration," 2018 IEEE 68th Electronic Components and Technology Conference (ECTC), 2018, pp. 202-207, doi: 10.1109/ECTC.2018.00039.

A. O. Watanabe et al., "3D Glass-Based Panel-Level Package with Antenna and Low-Loss Interconnects for Millimeter-Wave 5G Applications," 2019 IEEE MTT-S International Microwave Conference on Hardware and Systems for 5G and Beyond (IMC-5G), 2019, pp. 1-3, doi: 10.1109/IMC-5G47857.2019.9160350.

* cited by examiner

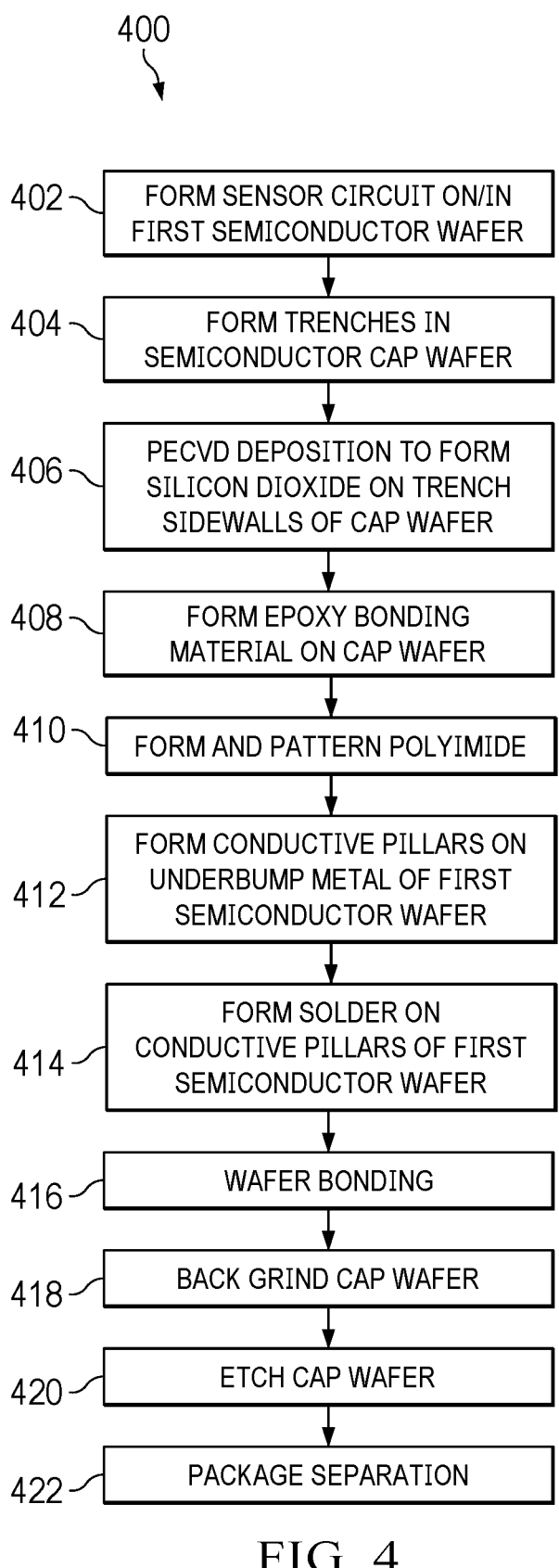

400

402 — FORM SENSOR CIRCUIT ON/IN FIRST SEMICONDUCTOR WAFER

404 — FORM TRENCHES IN SEMICONDUCTOR CAP WAFER

406 — PECVD DEPOSITION TO FORM SILICON DIOXIDE ON TRENCH SIDEWALLS OF CAP WAFER

408 — FORM EPOXY BONDING MATERIAL ON CAP WAFER

410 — FORM AND PATTERN POLYIMIDE

412 — FORM CONDUCTIVE PILLARS ON UNDERBUMP METAL OF FIRST SEMICONDUCTOR WAFER

414 — FORM SOLDER ON CONDUCTIVE PILLARS OF FIRST SEMICONDUCTOR WAFER

416 — WAFER BONDING

418 — BACK GRIND CAP WAFER

420 — ETCH CAP WAFER

422 — PACKAGE SEPARATION

FIG. 4

HIGH RELIABILITY SENSOR

BACKGROUND

Sensors are becoming an important part of many modern products and systems, such as smart phones, radar and other sensors for automotive applications, pressure, flow, temperature and/or humidity sensors, resonators and filters for industrial or other applications, sensors for medical systems, etc. Sensor applications may involve acoustic wave sensors and filters, such as bulk acoustic wave (BAW) and surface acoustic wave (SAW) devices. Modern applications may call for minimum package size and low profile electronic device packages that include sensor circuitry. Flip chip devices, such as flip chip, chip scale packages (FCCSP) can provide compact form factors that may include sensor circuits. These and other topologies often include conductive terminals extending from a sensor die to carry signals or supply power. Protective cap dies can be used to provide a protected cavity or chamber near the sensor circuitry of the sensor die, for example, to isolate the sensor circuit from mechanical stress caused by coefficient of thermal expansion (CTE) mismatches in the packaging structure in order to improve sensor performance. As device packages become smaller, the spacing between the conductive terminals and the semiconductor material of the protective cap die may be reduced and lead to short circuit or other device degradation or failure. One solution is to include through silicon via (TSV) structures in the protective cap die with suitable insulation along the sidewalls of the via, but this approach can inhibit efforts to reduce package height and increases manufacturing cost and complexity.

SUMMARY

In one aspect, an electronic device includes first and second semiconductor dies, where the first semiconductor die has a sensor circuit along the side of the first semiconductor die and a conductive terminal extending outward from the side of the first semiconductor die, and the second semiconductor die is bonded to the first semiconductor die. The second semiconductor die has a bottom side, a lateral side extending, and an insulation layer, with the bottom side spaced apart from and facing the side of the first semiconductor die to form a protected chamber for the sensor circuit, the lateral side of the second semiconductor die spaced apart from the conductive terminal, the insulation layer extending along the lateral side of the second semiconductor die, and the insulation layer spaced apart from and facing the conductive terminal.

In another aspect, a system includes a printed circuit board and an electronic device attached to the printed circuit board, where the electronic device includes a first semiconductor die with a sensor circuit along the side of the first semiconductor die and a conductive terminal extending outward from the side of the first semiconductor die, as well as a substrate connected to the conductive terminal and to the printed circuit board, and a second semiconductor die. The second semiconductor die is bonded to the first semiconductor die and has a bottom side, a lateral side, and an insulation layer, with the bottom side spaced apart from and facing the side of the first semiconductor die to form a protected chamber for the sensor circuit, the lateral side of the second semiconductor die spaced apart from the conductive terminal, the insulation layer extending along the lateral side of the second semiconductor die, and the insulation layer spaced apart from and facing the conductive terminal.

In a further aspect, a method of fabricating an electronic device includes forming trenches in a semiconductor wafer; forming an insulation layer on sidewalls of the trenches, bonding the semiconductor wafer to another semiconductor wafer with the insulation layer of the sidewalls of the trenches laterally spaced apart from conductive terminals of the other semiconductor wafer, grinding a back side of the semiconductor wafer; etching the back side of the semiconductor wafer, and singulating the semiconductor wafer and the other semiconductor wafer to separate an electronic device from the semiconductor wafer and the other semiconductor wafer.

BRIEF DESCRIPTION OF THE DRAWINGS

FIG. 4 is a flow diagram of a method of fabricating electronic devices.

DETAILED DESCRIPTION

Figure 1:
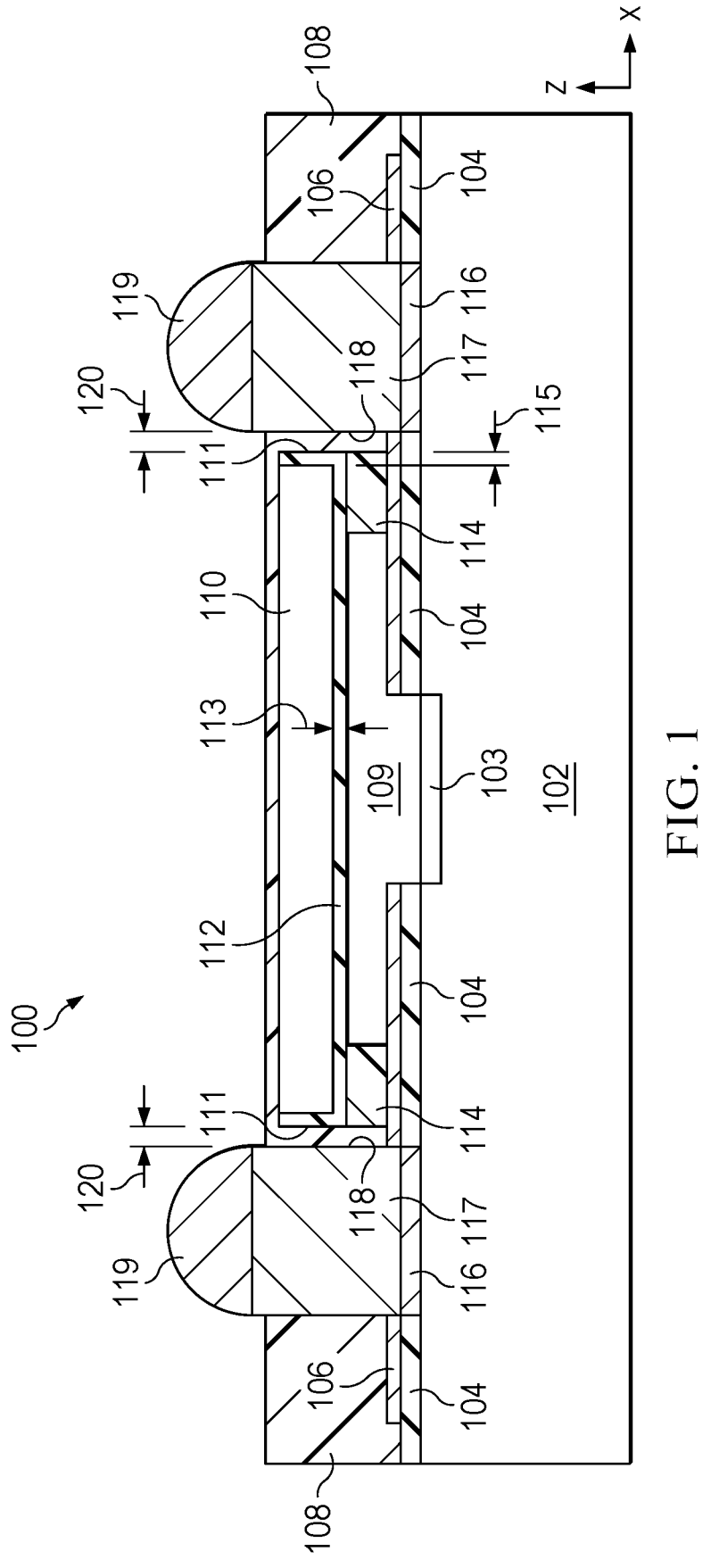
FIG. 1 is a sectional side elevation view of a flip chip, chip scale package electronic device with an insulation layer on sidewalls of a cap semiconductor die spaced apart from and facing a conductive terminal of another semiconductor die.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value. One or more operational characteristics of various circuits, systems and/or components are hereinafter described in the context of functions which in some cases result from configuration and/or interconnection of various structures when circuitry is powered and operating. One or more structures, features, aspects, components, etc. may be referred to herein as first, second, third, etc., such as first and second terminals, first, second, and third, wells, etc., for ease of description in connection with a particular drawing, where such are not to be construed as limiting with respect to the claims.

Figure 1A:
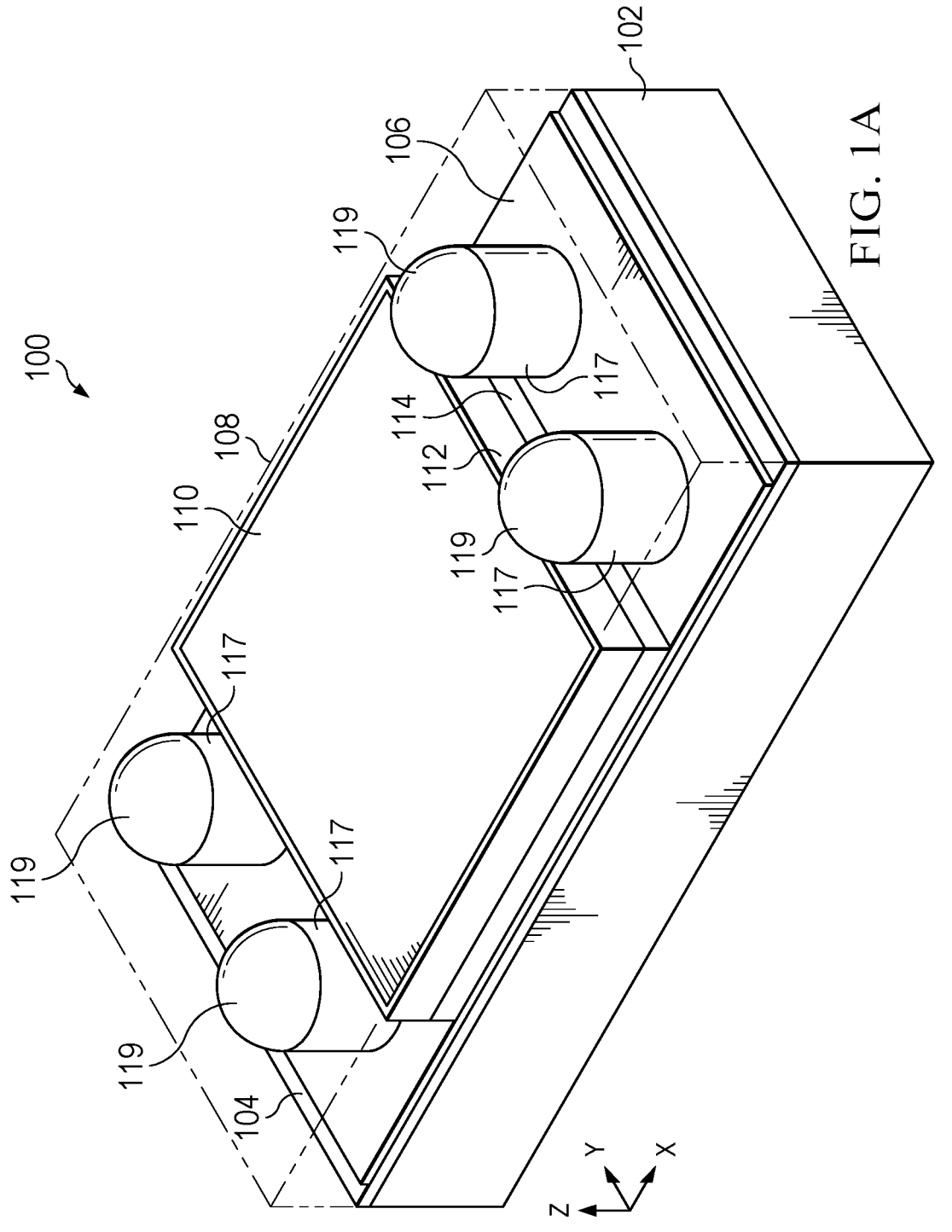
FIG. 1A a is a perspective view of the electronic device of FIG. 1.

FIGS. 1 and 1A show an electronic device 100 having a flip chip, chip scale package form with an insulation layer on sidewalls of a cap semiconductor die spaced apart from and facing a conductive terminal of another semiconductor die to mitigate or avoid short circuits and other potential causes of device degradation in a small, low profile package without the cost and complexity associated with TSV solutions. The electronic device 100 is shown in an example position in a three-dimensional space with a first direction X, a perpendicular (orthogonal) second direction Y (FIG. 1A), and a third direction Z that is perpendicular (orthogonal) to the respective first and second directions X and Y. Structures or features along any two of these directions are orthogonal to one another.

The electronic device 100 includes a first semiconductor die 102 with a sensor circuit 103 along the top side of the first semiconductor die 102. The top side of the first semiconductor die 102 extends in a first X-Y plane of the first and second directions in the illustrated orientation. Any suitable sensor circuit 103 can be provided in the first semiconductor die 102, such as pressure, temperature, flow, radar, and can include filters, oscillators or other circuitry (not shown).

The sensor circuit 103 in one example is configured to sense a condition or signal present in the environment near the top side of the first semiconductor die 102. The illustrated example includes a protective overcoat or passivation layer 104 over portions of the top side of the first semiconductor die 102. The protective overcoat layer 104 in one example is or includes one or more of silicon nitride and silicon oxide nitride, and other suitable materials can be used in different implementations. A patterned polyimide layer 106 is provided in one example over a portion of the protective overcoat layer 104. In one example, a molded package structure 108 is formed over the top sides of the protective overcoat layer 104 and the polyimide layer 106 and encloses other structures of the electronic device as shown in FIG. 1. In another example, the molded package structure 108 can be omitted (e.g., FIGS. 2 and 3 below).

The electronic device 100 includes a second semiconductor die 110, such as a silicon die, that is bonded to the first semiconductor die 102. The second semiconductor die 110 has a bottom side extending in a second X-Y plane of the respective first and second directions X and Y. The second semiconductor die 110 has a bottom side that is spaced apart from and faces the top side of the first semiconductor die 102 to form a protected chamber 109 for the sensor circuit 103, for example, to mitigate CTE mismatch stress effects on the operation of the sensor circuit 103. The second semiconductor die 102 also has lateral sides, including lateral sides 111 shown in the side view of FIG. 1. The lateral sides 111 extend in respective Y-Z planes of the second and third directions Y and Z.

In addition, the second semiconductor die 110 includes an insulation layer 112 that extends along the lateral sides 111 of the second semiconductor die 110. The insulation layer 112 in the illustrated example also extends along the bottom side of the second semiconductor die 110 as shown in FIG. 1, although not a requirement of all possible implementations. In the illustrated example, the insulation layer 112 along the bottom side of the second semiconductor die 110 has a thickness 113. In one example, the insulation layer 112 is or includes one of silicon dioxide, silicon nitride, and silicon oxynitride. Other suitable insulation layers 112 can be used in different examples to provide electrical insulation for the second semiconductor die 110.

As further shown in FIGS. 1 and 1A, the example electronic device 100 includes a bonding material 114 that extends along the third direction Z between a portion of the bottom side of the second semiconductor die 110 and the top side of the first semiconductor die 102. In one example, the bonding material 114 is or includes an epoxy or other suitable adhesive material that bonds the respective first and second semiconductor dies 102 and 110 to one another. In addition, the bonding material 114 in one example encircles the area around the exposed face of the sensor circuit 103 and forms sidewalls of the protected chamber 109. In one example, the protected chamber 109 is sealed by the bonding material 114, although not a strict requirement of all possible implementations. In another example, the bonding material 114 includes a gap or other opening that facilitates sensing of one or more environmental conditions outside the chamber 109 by the sensor circuit 103 (e.g., humidity, pressure, temperature, etc.).

As shown in FIG. 1, the insulation layer 112 along the lateral sides 111 of the second semiconductor die 110 have a thickness 115. In one example, the thicknesses 113 and 115 of the insulation layer 112 along the respective bottom and lateral sides 111 are approximately equal, although not a requirement of all possible implementations. The thickness 115 and the material of the insulation layer 112 can be tailored to provide a desired amount of electrical isolation between the second semiconductor die 110 and neighboring structures of the electronic device 100.

The electronic device 100 includes conductive metal terminals 117 that extend outward from the top side of the first semiconductor die 102 along the third direction Z to provide electrical connection for circuitry of the first semiconductor die 102 (e.g., the sensor circuit 103) and a host system or circuit, or to another structure (e.g., substrates as in FIGS. 2 and 3 below) to which the conductive terminals 117 are connected. The conductive terminals 117 in one example are or include copper or other suitable conductive metal, such as copper pillars or bumps formed during fabrication of the first semiconductor die 102. In the illustrated example, the conductive terminals 117 are formed over corresponding under bump metal (UBM) structures 116 formed along corresponding portions of the top side of the first semiconductor die 102. In the illustrated example, moreover, the top ends of the conductive terminals 117 are covered with solder 119 to facilitate solder connection of the electronic device to a host printed circuit board or to a substrate (e.g., FIGS. 2 and 3 below).

As shown in FIG. 1A, the conductive terminals 117 in the illustrated example are generally cylindrical, although not a requirement of all possible implementations. The conductive terminals 117 have associated sidewalls 118 (FIG. 1), portions of which laterally face inward toward the respective lateral sides 111 of the second semiconductor die 110. The lateral sides 111 of the second semiconductor die 110 are spaced apart from the conductive terminal 117 along the first direction X in the orientation of FIGS. 1 and 1A. The insulation layer 112 along the lateral sides 111 is spaced apart from and faces the sidewall 118 of the corresponding conductive terminal 117 by a spacing distance 120 along the first direction X. The lateral insulation layer thickness 115 and the material of the insulation layer 112, and the spacing distance 120 can be designed to provide adequate electrical isolation between the second semiconductor die 110 and the conductive terminals 117 to mitigate or avoid short circuits and other adverse electrical performance degradation of the electronic device and the sensor circuit 103 thereof. The optional molded package structure 108 in the illustrated implementation encloses the first semiconductor die 102, the second semiconductor die 110, and a portion of the conductive terminals 117, and can provide extra electrical isolation benefits in a host system. In other examples, the device includes a substrate and a molded package structure that partially encloses the substrate and other structures (e.g., FIG. 3 below).

The insulation layer 112 advantageously provides electrical isolation and insulation benefits while allowing close spacing (e.g., spacing distance 120 in FIG. 1) to help reduce the overall package size of the electronic device 100. Moreover, the formation of the insulation layer 112 along the lateral sides 111 of the second semiconductor die 110 provide significant process cost and complexity advantages compared with other insulation solutions such as through silicon via (TSV) approaches. Furthermore, the illustrated solution using the insulation layer 112 on the second semiconductor die 110 allows significantly lower device height compared with TSV solutions and allows the use of economical copper pillar or bump terminals to be formed during fabrication of the first semiconductor die 102 using conventional die bump processing and equipment.

Figure 2:
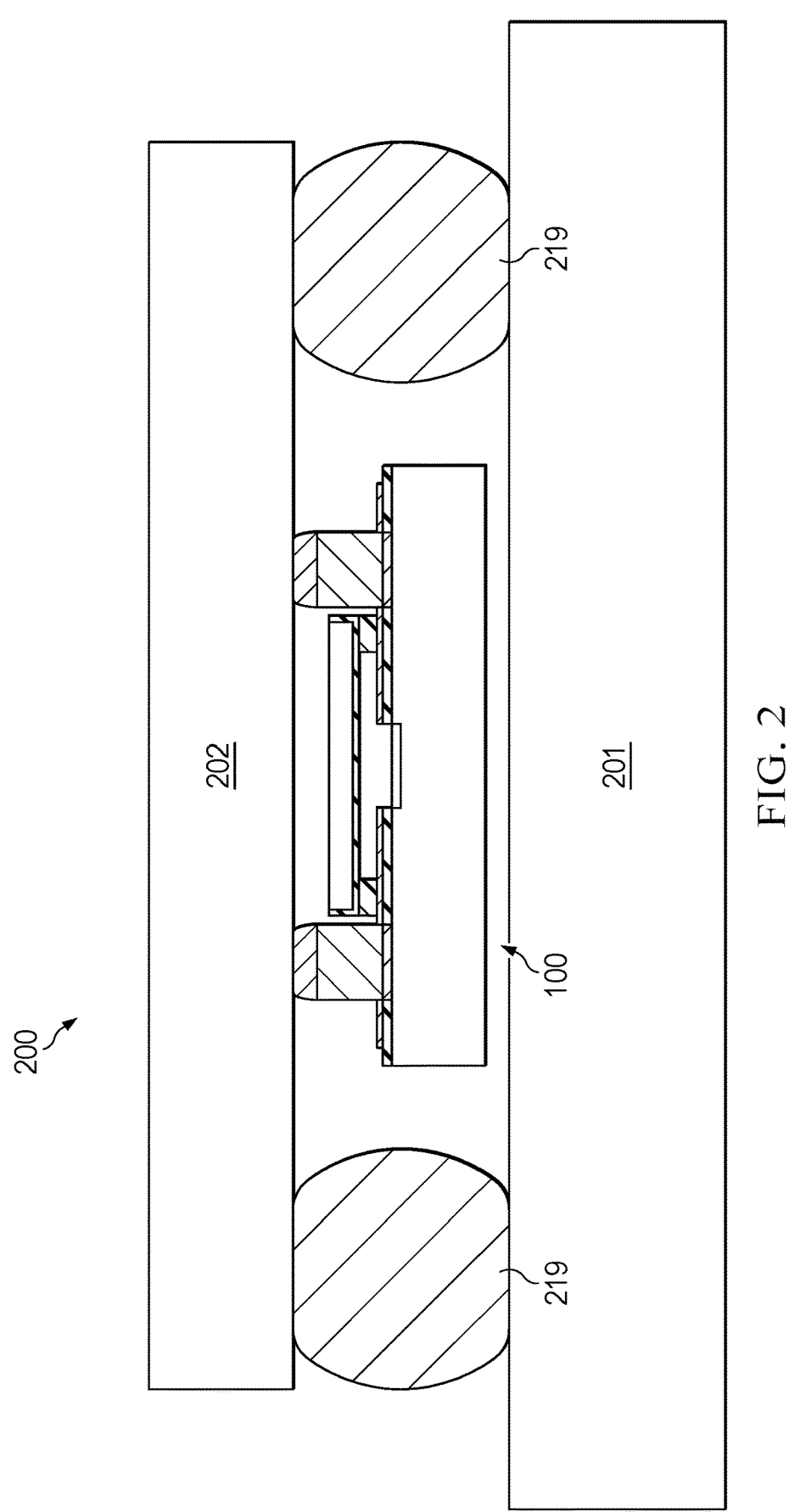
FIG. 2 is a side view of a system including the electronic device of FIGS. 1 and 1A.

FIG. 2 shows a partial side view of a system 200 with a printed circuit board 201. The system 200 includes an implementation of the electronic device 100 as described above in FIGS. 1 and 1A. The electronic device 100 in this example includes the first and second semiconductor dies as described above, as well as a substrate 202 that is connected to the conductive terminals 117 of the first semiconductor die. In one example, the substrate 202 is a single or multi-level package substrate with patterned conductive features (e.g., traces, pads, vias, etc., not shown) that provide signal and/or power routing with conductive connections for the conductive terminals 117 of the first semiconductor die, as well as one or more levels or layers of dielectric or other electrically insulating material between the patterned conductive features. In the illustrated implementation, moreover, the first semiconductor die 102 is flip chip attached to the substrate 202 by the conductive terminal 117. The electronic device 100 also includes solder balls 219 connected to the substrate 202, which are soldered to the printed circuit board 201 in the illustrated system 200. Different electrical connections can be made between the substrate 202 and the printed circuit board 201 and other implementations, for example, flip chip attachment by copper pillars or bumps (not shown) along the bottom side of the substrate 202 or other suitable structures and systems to connect the substrate 202 electrically and mechanically to the conductive terminals 117 and to the printed circuit board 201.

Figure 3:
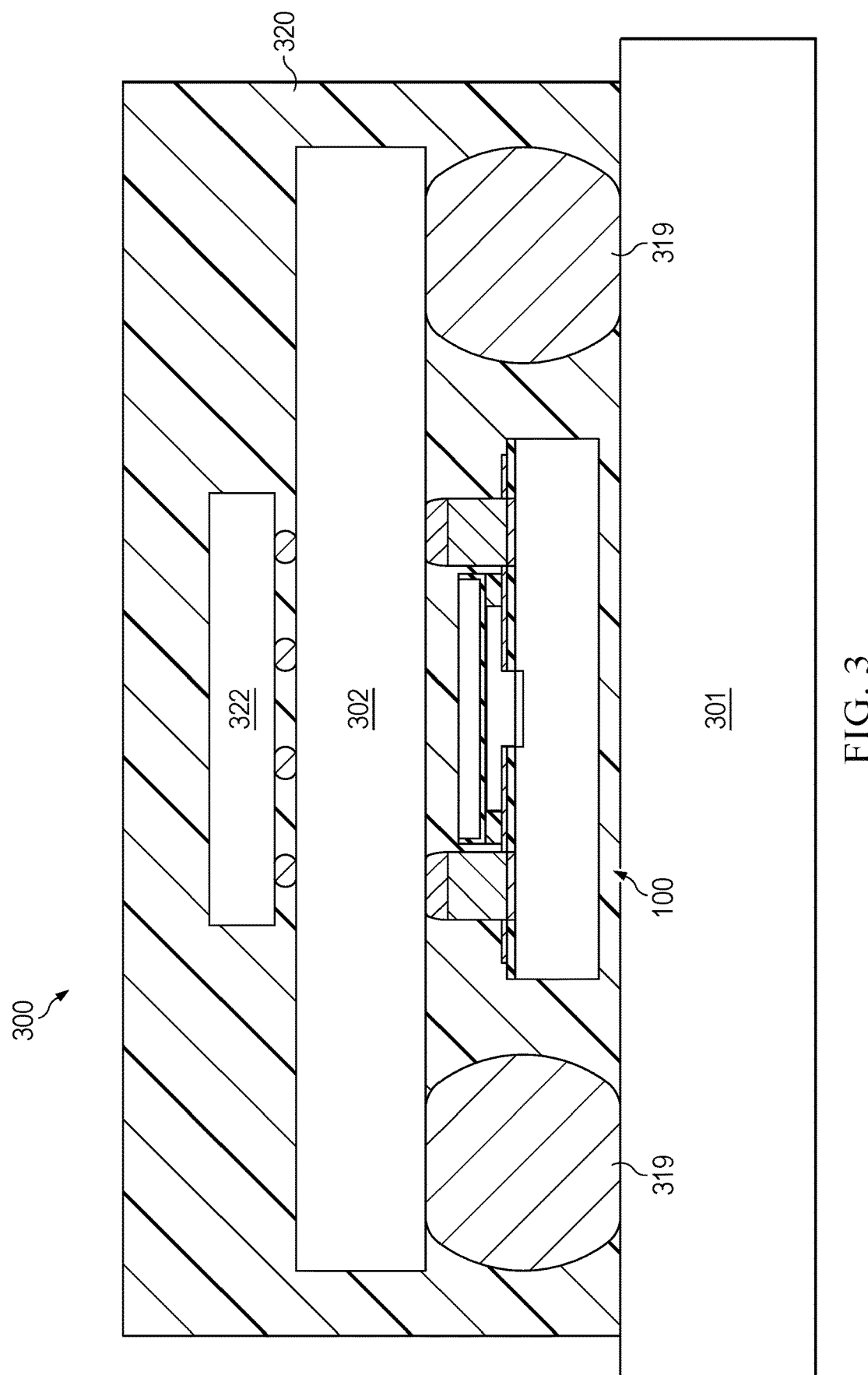
FIG. 3 is a side view of another system including the electronic device of FIGS. 1 and 1A.

FIG. 3 shows a side view of another system 300 including the electronic device of FIGS. 1 and 1A. The electronic device 100 in this example includes the first and second semiconductor dies as described above, as well as a substrate 302 that is connected to the conductive terminals 117 of the first semiconductor die. In one example, the substrate 302 is a single or multilevel package substrate with patterned conductive features (e.g., traces, pads, vias, etc., not shown) that provide signal and/or power routing with conductive connections for the conductive terminals 117 of the first semiconductor die, as well as one or more levels or layers of dielectric or other electrically insulating material between the patterned conductive features. In the illustrated implementation, moreover, the first semiconductor die 102 is flip chip attached to the substrate 302 by the conductive terminals 117. The electronic device 100 also includes solder balls 319 (e.g., or other suitable conductive terminals or structures) connected to the substrate 302, which are soldered to the printed circuit board 301 in the illustrated system 300. In addition, the electronic device 100 in this example also includes a third semiconductor die 322 connected to the substrate 302, for example, by flip chip soldering.

This implementation shows further modular adaptability of the electronic device design possibilities using the first and second semiconductor dies described above in connection with FIGS. 1 and 1A in combination with the substrate 302, where the substrate 302 can accommodate one or more additional electronic components (e.g., passive components such as resistors, capacitors, etc.) and/or additional semiconductor dies (not shown). In one implementation, the electronic device further comprises a package structure 320, such as a molded plastic structure that encloses the first semiconductor die 102, the second semiconductor die 110, all or portions of the substrate 302, and the conductive terminals 117. In another implementation, the package structure 320 does not extend down to the printed circuit board 301. In a further implementation, the package structure 320 can be omitted. In yet another limitation, the electronic device 100 can include the package structure 108 described above in connection with FIGS. 1 and 1A in combination with the substrate 302 and the third semiconductor die 322.

Referring now to FIGS. 4-15, FIG. 4 shows a method 400 of fabricating electronic devices, and FIGS. 5-15 show the electronic device 100 undergoing fabrication processing according to the method 400. The illustrated method 400 includes separate wafer processing of first and second wafers with corresponding unit areas or regions associated with individual instances of the respective first and second semiconductor dies 102 and 110 as described above, as well as wafer bonding to bond the separately processed wafers together in fabricating multiple individual electronic devices 100. This example implementation facilitates reduced manufacturing cost and processing time by concurrent fabrication of multiple electronic devices with a significant amount of processing performed at the wafer level.

Figure 5:
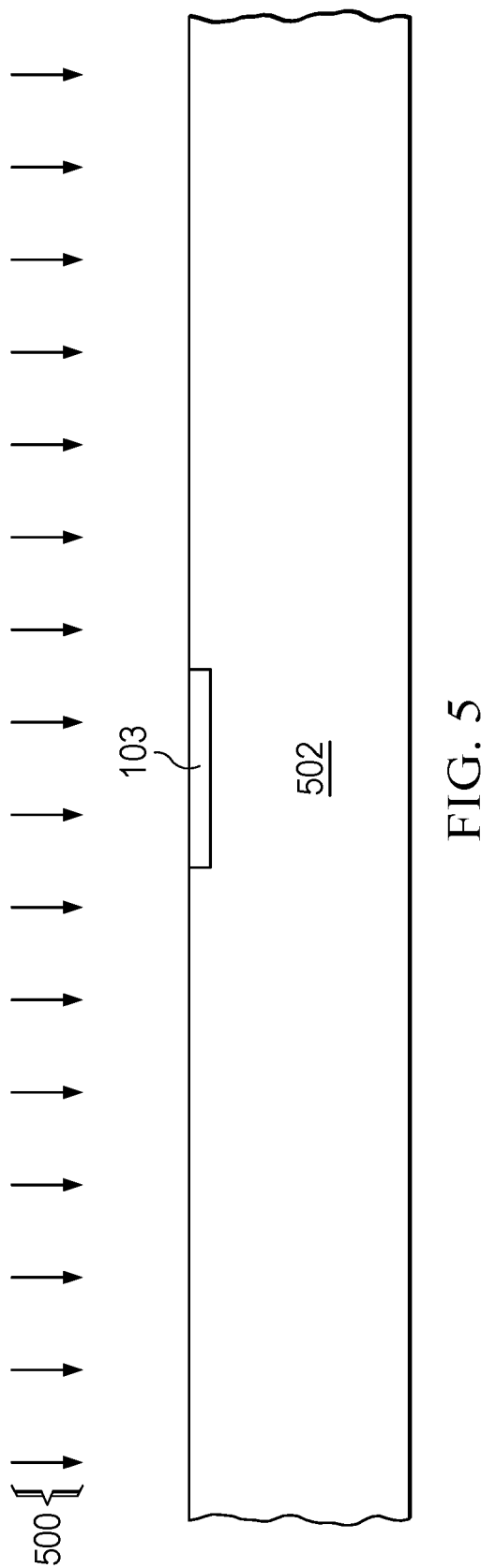
FIGS. 5-15 are partial sectional side elevation views of the electronic device of FIGS. 1 and 1A undergoing fabrication processing according to one example implementation of the method of FIG. 4.

The method 400 begins at 402 in FIG. 4 with formation of multiple instances of the sensor circuit 103 on and/or in a first semiconductor wafer. FIG. 5 shows one simplified example in which various semiconductor manufacturing processes and steps are depicted as a circuit fabrication process 500 performed on a first starting semiconductor wafer 502. Only a portion of the first wafer 502 is illustrated, and the illustrated portion includes the above-described sensor circuit 103 formed on and/or in a top side of the wafer 502.

Figure 6:
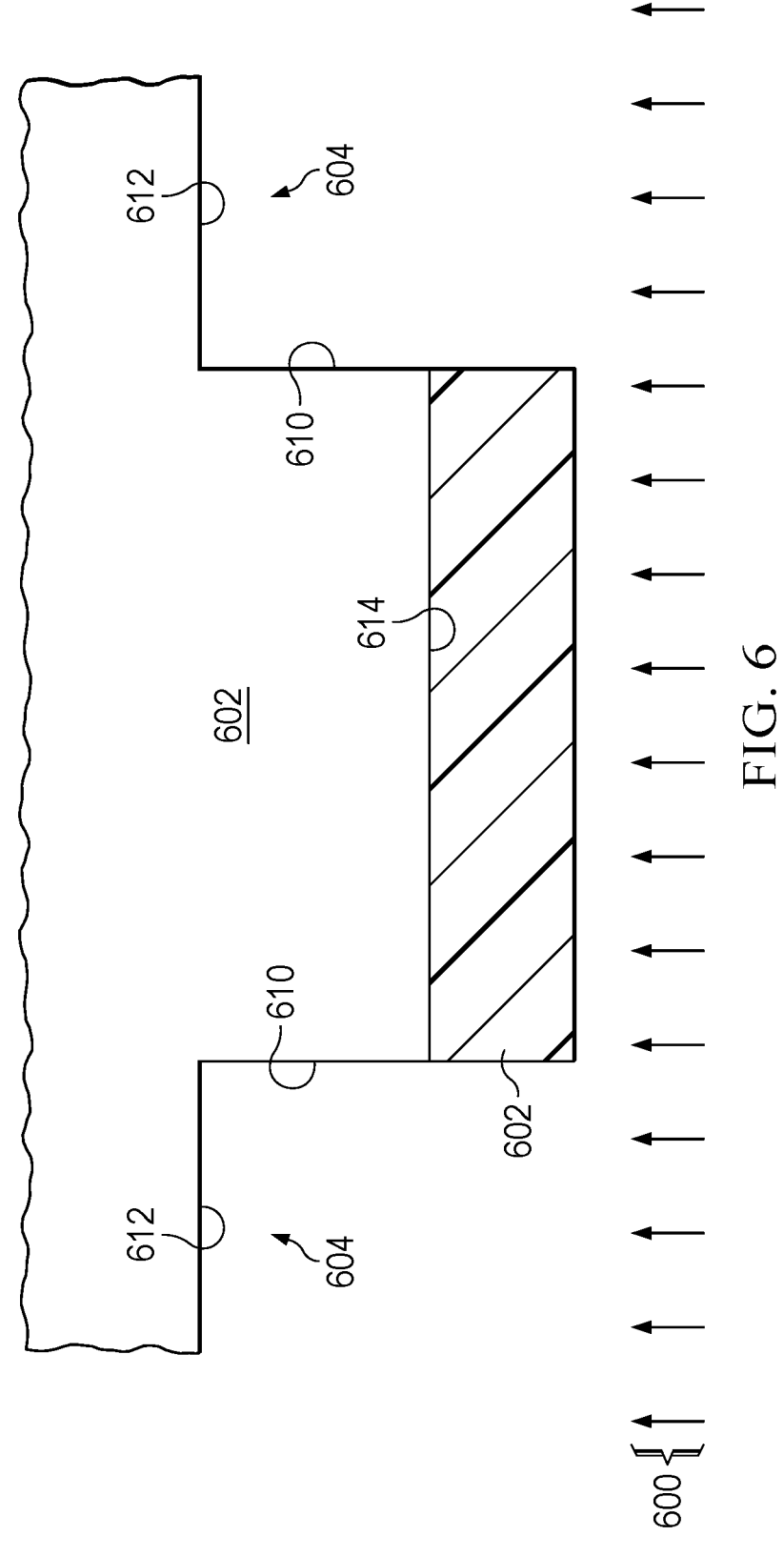

The method 400 continues at 404 in FIG. 4 with trench formation in a second semiconductor wafer, also referred to as a cap wafer. FIG. 6 shows one example, in which a trench etch process 600 is performed on a second starting semiconductor wafer 602 (e.g., a second silicon wafer) using a trench etch mask 602. The etch process 600 selectively etches the exposed portions of the bottom side of the wafer 602 in order to form multiple trenches 604 having trench sidewalls 610 and trench bottoms 612. FIG. 6 shows only a portion of the second wafer 602, and the illustrated portion represents further unit areas or regions of the wafer 602 having similar structures including the trenches 604 that extend between adjacent unit areas or regions. The etch process 600 forms the trenches 604 to a trench depth determined by the dimensions of the desired finished electronic device 100 such that a starting bottom side 614 of the wafer 602 is spaced apart from the trench bottoms 612 by a distance sufficient to allow placement of the bottom side 614 extends above the tops of the bonding material structures 114 in FIG. 1 by the expected thickness 113 of the insulation layer 112, while the trench bottoms 612 will be adequately spaced along the third direction Z above the tops of the solder structures 119 in FIG. 1 above.

Figure 7:
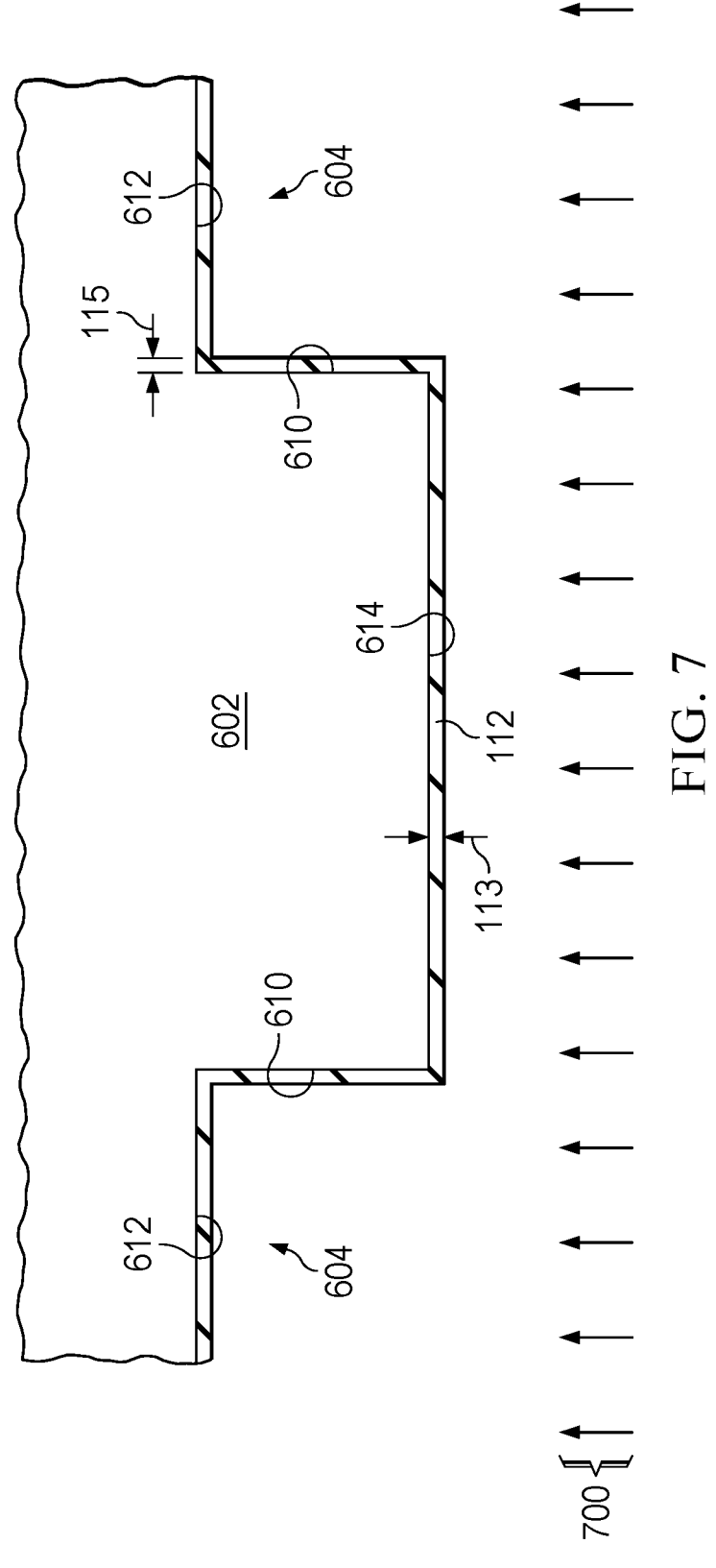

An insulation layer is then formed along the trench sidewalls at 406 in FIG. 4. FIG. 7 shows one example, in which a deposition process 700 is performed that deposits the insulation layer 112 to the above-described thicknesses 113 and 115 along the trench sidewalls 610 and the bottom side 614, as well as on the trench bottoms 612 of the wafer 602. In one example, the deposition process 700 is a plasma enhanced chemical vapor deposition (PECVD) process. Different deposition or layer formation techniques can be used in other implementations. In another implementation, the insulation layer 112 is formed at 404 only along the trench sidewalls 610. In one example, the deposited insulation layer 112 is or includes one of silicon dioxide, silicon nitride, and silicon oxynitride or other suitable insulation material.

Figure 8:
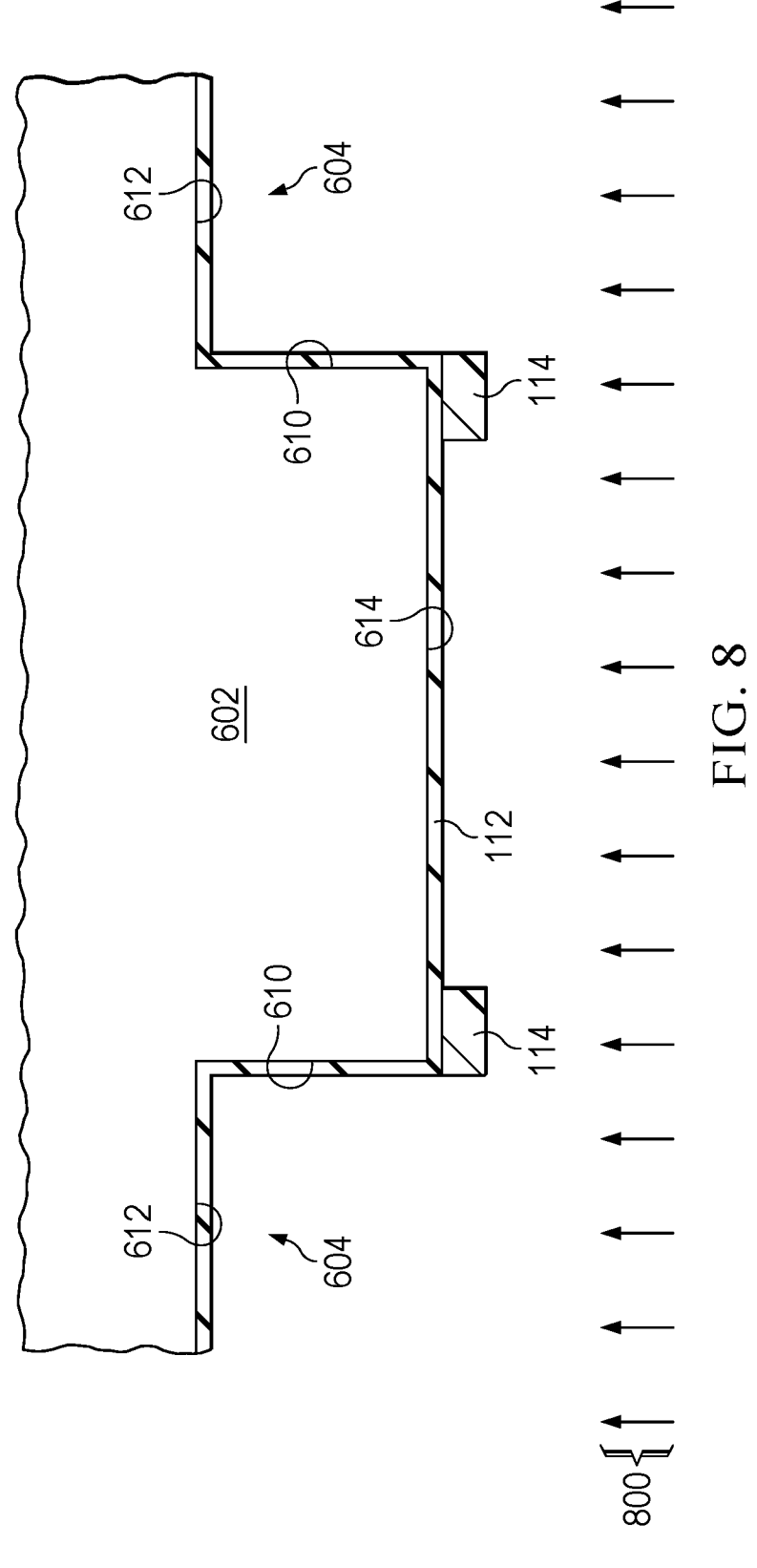

At 408, epoxy bonding material is formed on portions of the second semiconductor wafer. FIG. 8 shows one example, in which a dispensing and patterning or other suitable bonding material formation process 800 is performed that forms the epoxy bonding material 114 on the insulation layer 112 in select portions of the starting bottom side 614 of the second semiconductor wafer 602.

Figure 9:
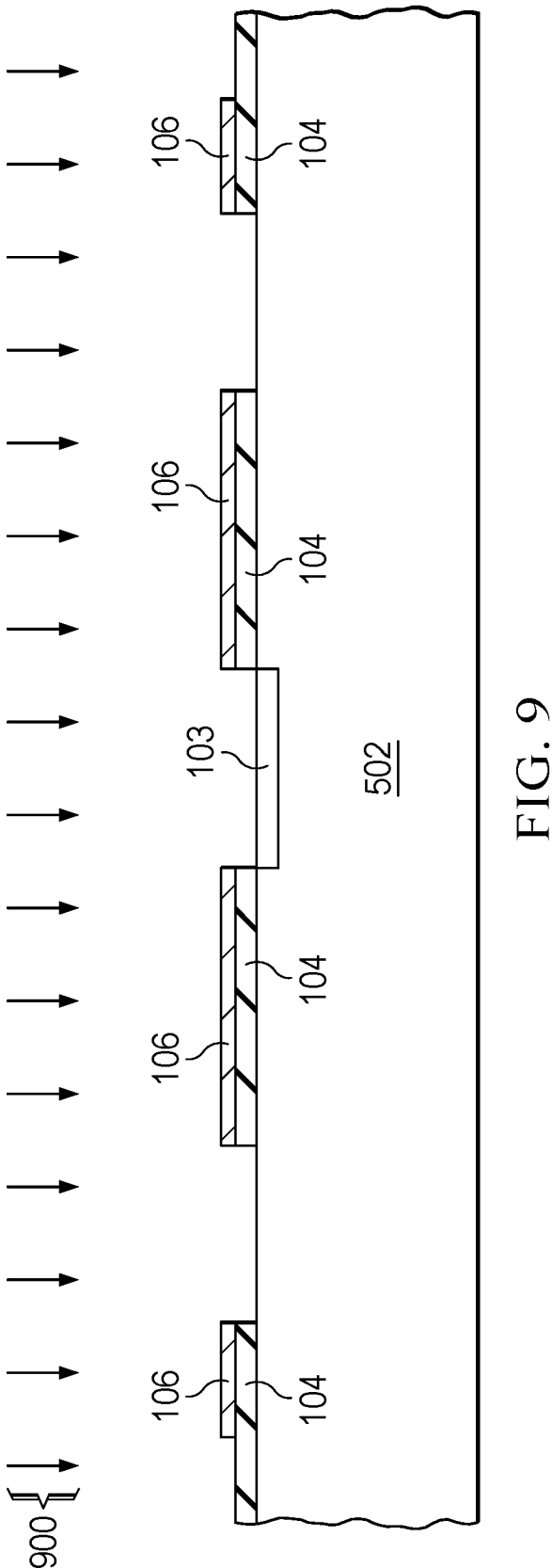

The method 400 in one example continues at 410 in FIG. 4 with forming and patterning the polyimide layer on the first wafer. FIG. 9 shows one example, in which a process 900 is performed that deposits and patterns the polyimide layer 106 on the top side of select portions of the previously formed protective overcoat layer 104.

Figure 10:
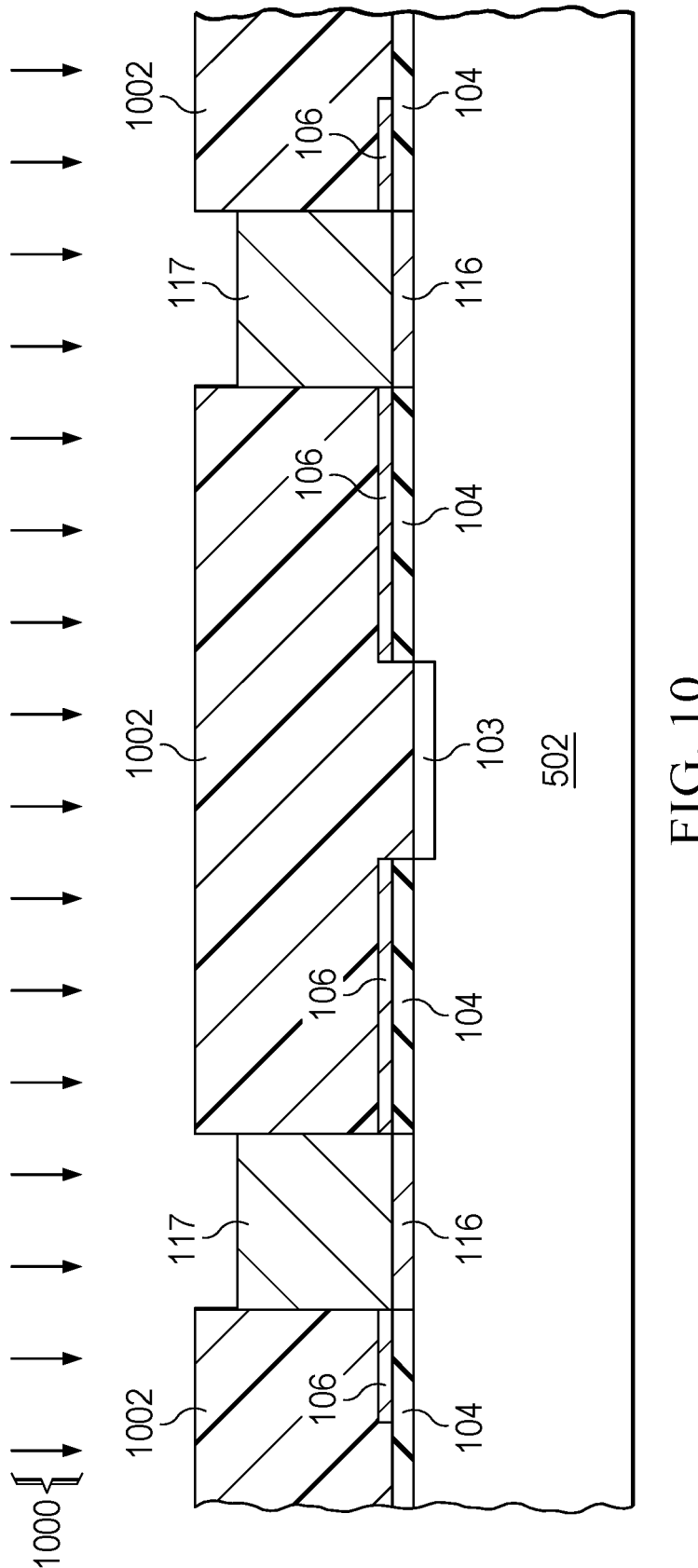

The method 400 continues in FIG. 4 at 412 with formation of the conductive terminals in respective unit areas of the first processed wafer. FIG. 10 shows one example, with previously formed and patterned protective overcoat layer 104 and under bump metal structures 116 on the first semiconductor wafer 502. In one example, a copper seed layer (not shown) is deposited and an electroplating deposition process 1000 is performed in the example of FIG. 10 with a plating mask 1002 (e.g., photoresist) to deposit a copper or other suitable metal and form the conductive terminals 117 on the exposed portions of the under bump metal structures 116 to a suitable height determined by the final electronic device design. Following the deposition process 1000, the plating mask 1002 is removed and remnant portions of the copper seed layer are etched.

Figure 11:
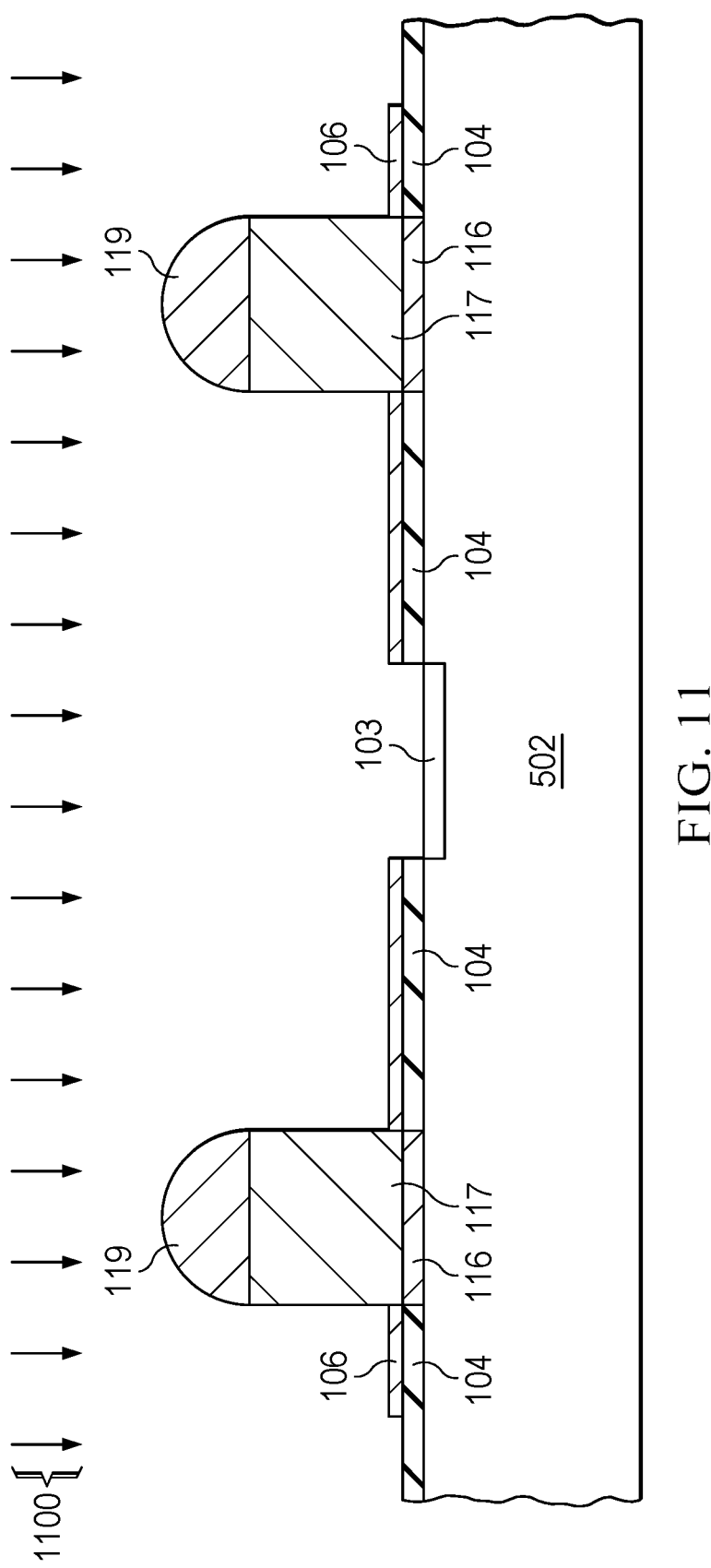

At 414 in FIG. 4, the method 400 continues with solder formation on the conductive terminals 117. FIG. 11 shows one example, in which a process 1100 is performed that forms the solder structures 119 on the top sides of the conductive terminals 117.

Figure 12:
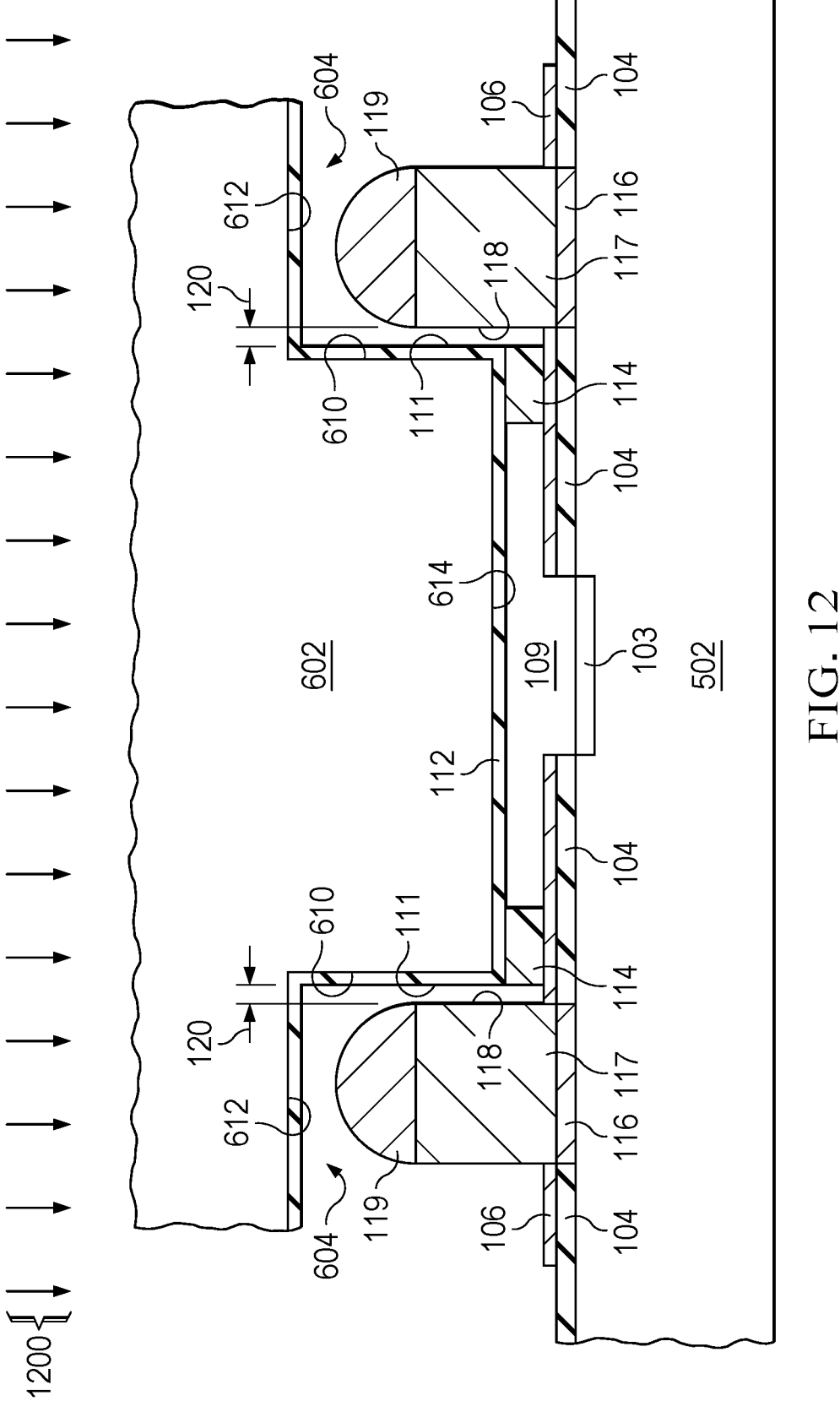

The method 400 further includes wafer bonding processing to bond the respective first and second wafers 502 and 602 to one another. The wafers 502 and 602 are bonded together at 416 in FIG. 4. FIG. 12 shows one example, in which a wafer bonding process 1200 is performed that bonds the first and second wafers 502 and 602 to one another, for example, using automated positioning equipment (not shown) with the insulation layer 112 of the sidewalls 610 of the trenches 604 laterally spaced apart from conductive terminals 117 of the other semiconductor wafer 502, and with the insulation layer 112 of the starting bottom side 614 of the second wafer 602 engaging the epoxy bonding material 114. The wafer bonding process 1200 in one example further includes one or more thermal, UV, or other curing steps to cure the epoxy bonding material 114 to complete the wafer bonding.

Figure 13:
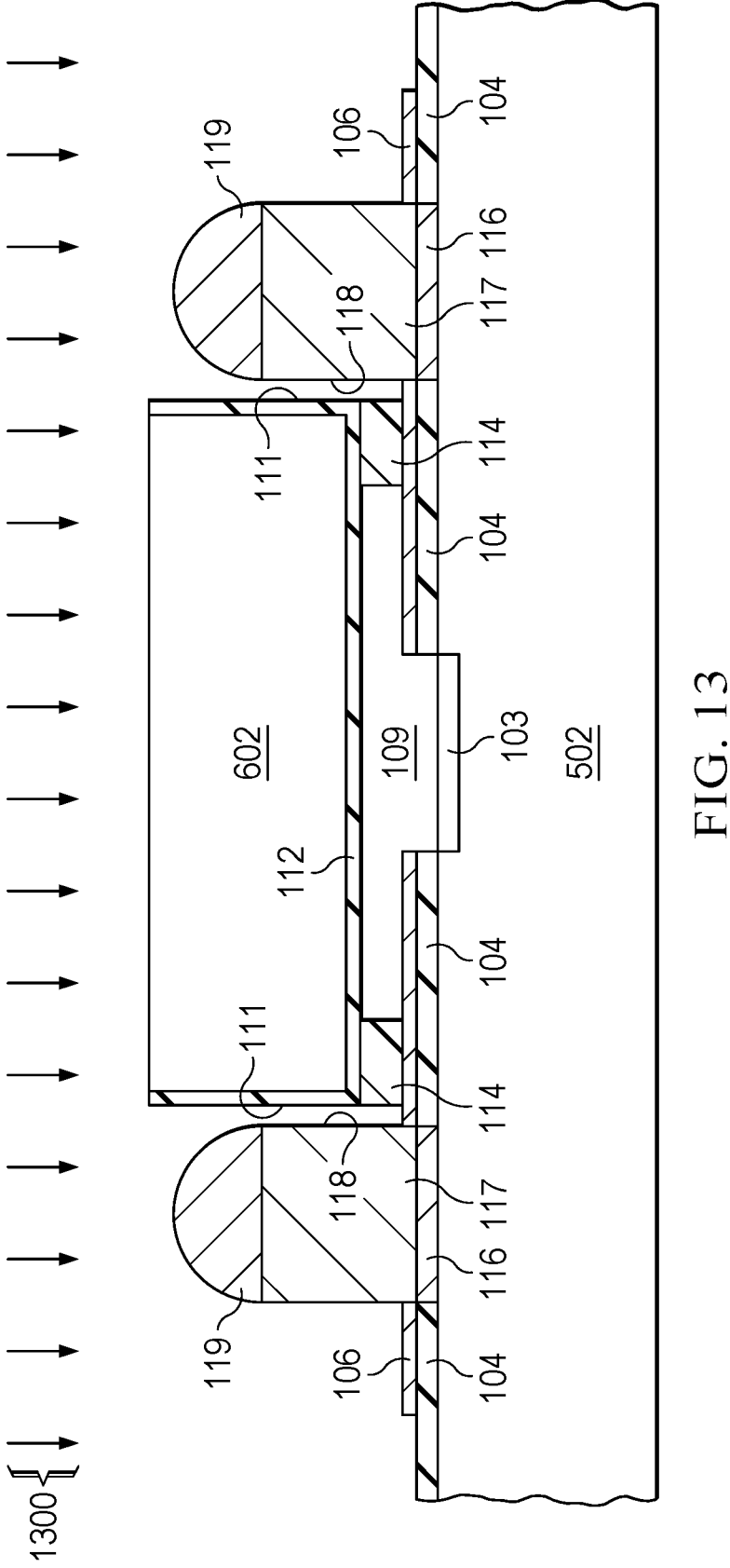

The method 400 continues at 418 in FIG. 4 in one example with back grinding the second wafer 602. FIG. 13 shows one example, in which a back grinding process 1300 is performed using a suitable grinding tool (not shown) that grinds the back side of the second semiconductor wafer 602, and the grinding process 1300 continues in one example until the trench bottoms are completely removed. The grinding process 1300 stops while the back side of the second semiconductor wafer 602 is vertically above the tops of the solder structures 119 as shown in FIG. 13. The back grinding at 418 in one example substantially separates remaining portions of the second wafer 602 from one another, with the remnant portions of the wafer 602 positioned in the respective unit areas of the first semiconductor wafer 502 to provide a top lid or cap for the protected chamber 109 of the respective sensor circuits 103.

Figure 14:
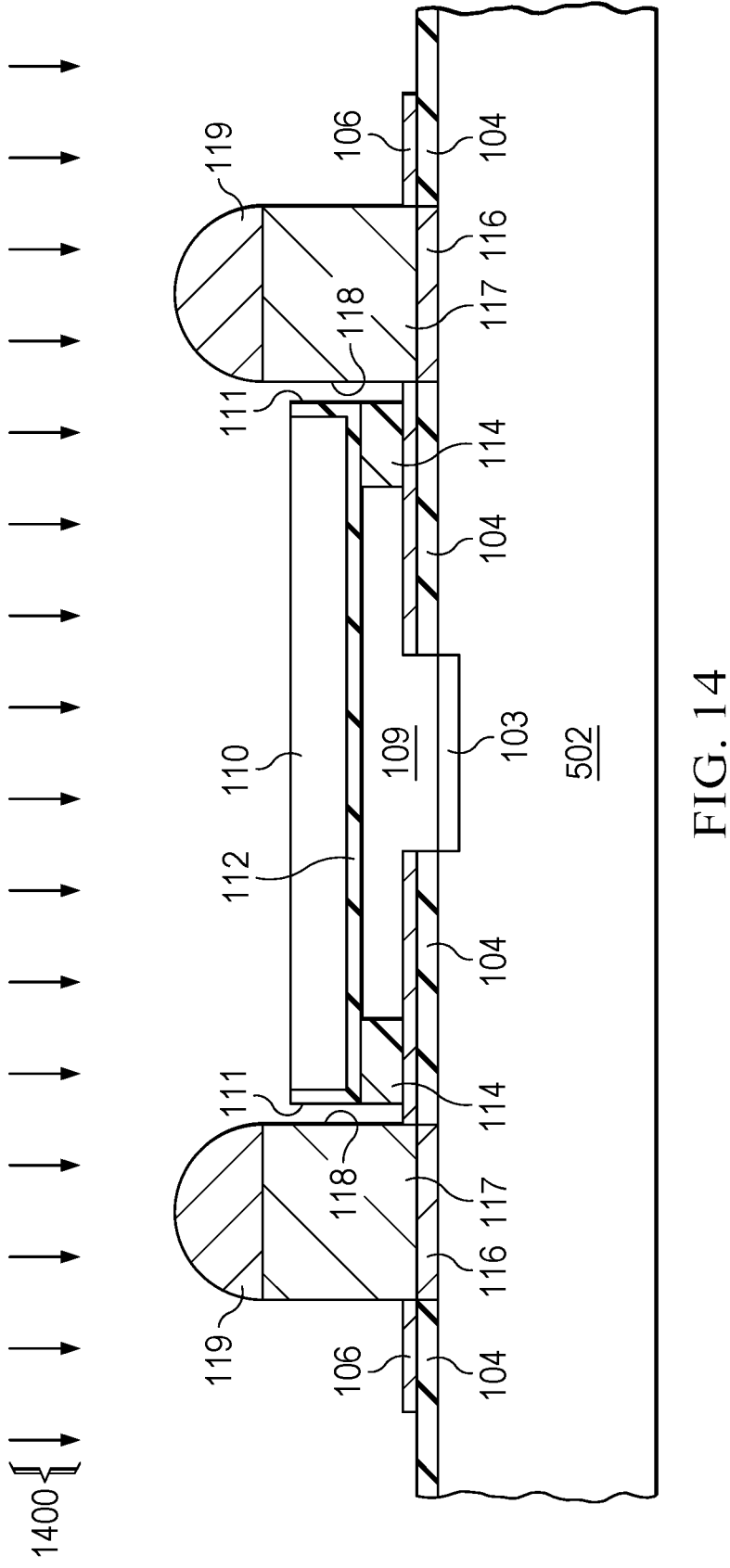

The method 400 continues at 420 in FIG. 4 with etching of the remnant portions of the second or cap wafer 602. FIG. 14 shows one example, in which an etch process 1400 is performed that is selective to silicon and the insulation layer 112 without significantly impacting the, and the etch process 1400 conductive terminal and solder structures 117 and 119 or the protective overcoat and polyimide layers 104 and 106. The etch process 1400 selectively removes further portions of the back side of the second wafer (shown as the second semiconductor die labeled 110 in FIG. 14) and further lateral portions of the insulation layer 112 along the lateral sides 111.

Figure 15:
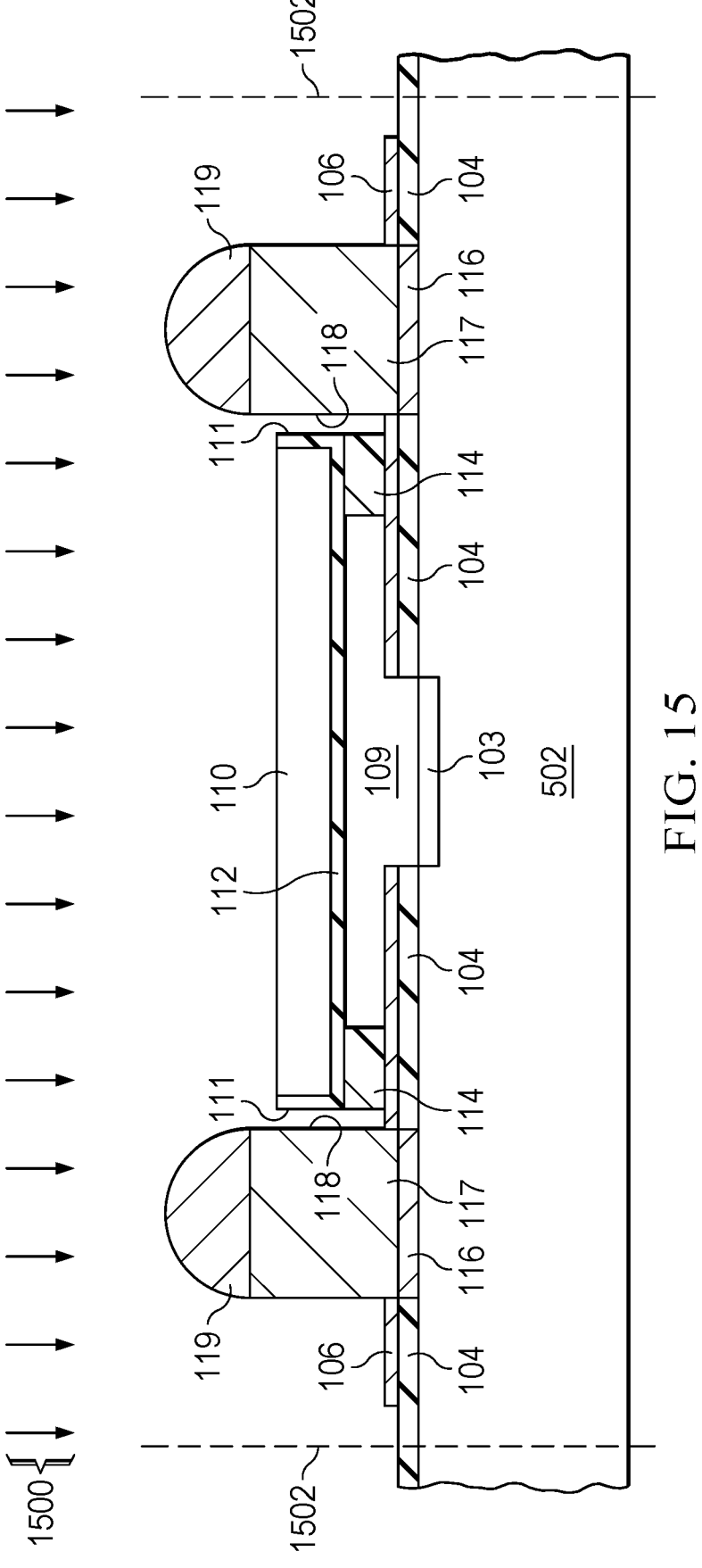

The method 400 continues at 422 in FIG. 4 with device or package separation. FIG. 15 shows one example, in which a cutting or other separation process 1500 is performed that cuts or separates individual electronic devices 100 along lines 1502 from the first wafer structure. The package separation at 422 provides multiple instances of the electronic device 100 as described above in connection with FIGS. 1 and 1A. In other examples, further packaging processes or steps (not shown) can be performed, for example, such as molding, flip chip attachment of the illustrated portion of the electronic device to a substrate using the conductive terminals 117 (e.g., as shown in FIGS. 2 and 3 above), etc.

Modifications are possible in the described examples, and other implementations are possible, within the scope of the claims.

What is claimed is:

1. An electronic device, comprising:
   a first semiconductor die having: a side extending in a first plane of orthogonal first and second directions; a sensor circuit along the side of the first semiconductor die; and a conductive terminal extending outward from the side of the first semiconductor die along a third direction that is orthogonal to the first and second directions; and
   a second semiconductor die bonded to the first semiconductor die and having: a bottom side extending in a second plane of the first and second directions; a lateral side extending in a plane of the second and third directions; and an insulation layer, the bottom side spaced apart from and facing the side of the first semiconductor die to form a protected chamber for the sensor circuit, the lateral side of the second semiconductor die spaced apart from the conductive terminal along the first direction, the insulation layer extending along the lateral side of the second semiconductor die, and the insulation layer spaced apart from and facing the conductive terminal along the first direction.

2. The electronic device of claim 1, wherein the insulation layer extends along the bottom side of the second semiconductor die.

3. The electronic device of claim 1, wherein the insulation layer includes one of silicon dioxide, silicon nitride, and silicon oxynitride.

4. The electronic device of claim 1, comprising a bonding material extending along the third direction between a portion of the bottom side of the second semiconductor die and the side of the first semiconductor die to bond the first and second semiconductor dies to one another and form sidewalls of the protected chamber.

5. The electronic device of claim 4, wherein the bonding material includes an epoxy.

6. The electronic device of claim 4, wherein the protected chamber is sealed by the bonding material.

7. The electronic device of claim 1, comprising a substrate connected to the conductive terminal.

8. The electronic device of claim 7, comprising a third semiconductor die connected to the substrate.

9. The electronic device of claim 7, comprising a package structure that encloses the first semiconductor die, the second semiconductor die, the substrate, and the conductive terminal.

10. The electronic device of claim 7, comprising solder balls connected to the substrate.

11. The electronic device of claim 1, comprising a package structure that encloses the first semiconductor die, the second semiconductor die, and a portion of the conductive terminal.

12. A system, comprising:
a printed circuit board;
an electronic device attached to the printed circuit board and comprising:
a first semiconductor die having: a side extending in a first plane of orthogonal first and second directions; a sensor circuit along the side of the first semiconductor die; and a conductive terminal extending outward from the side of the first semiconductor die along a third direction that is orthogonal to the first and second directions;
a substrate connected to the conductive terminal and to the printed circuit board; and
a second semiconductor die bonded to the first semiconductor die and having: a bottom side extending in a second plane of the first and second directions; a lateral side extending in a plane of the second and third directions; and an insulation layer, the bottom side spaced apart from and facing the side of the first semiconductor die to form a protected chamber for the sensor circuit, the lateral side of the second semiconductor die spaced apart from the conductive terminal along the first direction, the insulation layer extending along the lateral side of the second semiconductor die, and the insulation layer spaced apart from and facing the conductive terminal along the first direction.

13. The system of claim 12, wherein the first semiconductor die is flip chip attached to the substrate by the conductive terminal.

14. The system of claim 12, wherein the insulation layer extends along the bottom side of the second semiconductor die.

15. The system of claim 12, wherein the insulation layer includes one of silicon dioxide, silicon nitride, and silicon oxynitride.

16. The system of claim 12, comprising solder balls connected to the substrate.

17. The system of claim 12, comprising a package structure that encloses the first semiconductor die, the second semiconductor die, and a portion of the conductive terminal.

18. A method of fabricating an electronic device, the method comprising:
forming trenches in a semiconductor wafer;
forming an insulation layer on sidewalls of the trenches;
bonding the semiconductor wafer to another semiconductor wafer with the insulation layer of the sidewalls of the trenches laterally spaced apart from conductive terminals of the other semiconductor wafer;
grinding a back side of the semiconductor wafer;
etching the back side of the semiconductor wafer; and
singulating the semiconductor wafer and the other semiconductor wafer to separate an electronic device from the semiconductor wafer and the other semiconductor wafer.

19. The method of claim 18, wherein forming the insulation layer includes performing a plasma enhanced chemical vapor deposition process to deposit the insulation layer on the sidewalls of the trenches.

20. The method of claim 18, wherein the insulation layer includes one of silicon dioxide, silicon nitride, and silicon oxynitride.

* * * * *